United States Patent
Nackaerts et al.

(10) Patent No.: US 10,060,817 B2
(45) Date of Patent: *Aug. 28, 2018

(54) INTEGRATED CIRCUIT WITH A PRESSURE SENSOR

(71) Applicant: ams International AG, Rapperswil-Jona (CH)

(72) Inventors: Axel Nackaerts, Heverlee (BE); Willem Frederik Adrianus Besling, Eindhoven (NL); Klaus Reimann, Eindhoven (NL)

(73) Assignee: ams International AG, Rapperswil-Jona (CH)

(*) Notice: Subject to any disclaimer, the term of this patent is extended or adjusted under 35 U.S.C. 154(b) by 0 days.

This patent is subject to a terminal disclaimer.

(21) Appl. No.: 15/258,988

(22) Filed: Sep. 7, 2016

(65) Prior Publication Data
US 2016/0377497 A1    Dec. 29, 2016

Related U.S. Application Data

(60) Continuation of application No. 15/050,418, filed on Feb. 22, 2016, now Pat. No. 9,481,570, which is a
(Continued)

(30) Foreign Application Priority Data

Jun. 12, 2012  (EP) ..................................... 12171649

(51) Int. Cl.
*H01L 29/84* (2006.01)
*G01L 9/00* (2006.01)
(Continued)

(52) U.S. Cl.
CPC ............ *G01L 9/0073* (2013.01); *B81B 7/008* (2013.01); *B81C 1/00246* (2013.01);
(Continued)

(58) Field of Classification Search
CPC ..... G01L 9/0073; G01L 9/0042; H01L 21/28; H01L 29/84; B81B 7/008;
(Continued)

(56) References Cited

U.S. PATENT DOCUMENTS 5,604,313 A * 2/1997 Cahill ................. G01P 15/0802
257/415
5,627,396 A * 5/1997 James ................ H01H 59/0009
200/83 N
(Continued)

OTHER PUBLICATIONS

Extended European Search Report for Patent Application No. 12171649.2 (dated Nov. 13, 2012).
(Continued)

*Primary Examiner* — Dzung Tran
(74) *Attorney, Agent, or Firm* — McDermott Will & Emery LLP (57) ABSTRACT

Disclosed is an integrated circuit, comprising a semiconductor substrate carrying a plurality of circuit elements; and a pressure sensor including a cavity on said semiconductor substrate, said cavity comprising a pair of electrodes laterally separated from each other; and a flexible membrane over and spatially separated from said electrodes such that said membrane interferes with a fringe field between said electrodes, said membrane comprising at least one aperture. A method of manufacturing such an IC is also disclosed.

7 Claims, 5 Drawing Sheets

Related U.S. Application Data division of application No. 13/915,523, filed on Jun. 11, 2013, now Pat. No. 9,269,832.

(51) Int. Cl.
 *H01L 21/28* (2006.01)
 *B81C 1/00* (2006.01)
 *B81B 7/00* (2006.01)

(52) U.S. Cl.
 CPC ............ *G01L 9/0042* (2013.01); *H01L 21/28* (2013.01); *H01L 29/84* (2013.01); *B81B 2201/0264* (2013.01); *B81B 2203/0127* (2013.01); *B81B 2207/015* (2013.01); *B81C 2203/0735* (2013.01); *B81C 2203/0771* (2013.01)

(58) Field of Classification Search
 CPC .... B81B 2201/0264; B81B 2203/0127; B81B 2207/015; B81C 1/00246; B81C 2203/0735; B81C 2203/0771
 USPC .......................................................... 257/415
 See application file for complete search history.

(56) References Cited

U.S. PATENT DOCUMENTS

| | | | | |
|---|---|---|---|---|
| 6,012,336 | A * | 1/2000 | Eaton | B81C 1/00246 73/754 |
| 6,034,414 | A * | 3/2000 | Lin | H01G 5/16 257/312 |
| 6,110,791 | A | 8/2000 | Kalnitsky et al. | |
| 6,140,689 | A | 10/2000 | Scheiter et al. | |
| 6,828,801 | B1 | 12/2004 | Burdick et al. | |
| 7,102,472 | B1 | 9/2006 | Nathanson et al. | |
| 8,141,430 | B2 | 3/2012 | Fortner et al. | |
| 2003/0094047 | A1 | 5/2003 | Torkkeli | |
| 2004/0239341 | A1 | 12/2004 | Aoyagi et al. | |
| 2004/0264193 | A1 | 12/2004 | Okumura | |
| 2006/0056004 | A1 | 3/2006 | Jilani et al. | |
| 2006/0201249 | A1 | 9/2006 | Horning et al. | |
| 2006/0276015 | A1 | 12/2006 | Morris | |
| 2007/0025050 | A1 | 2/2007 | Shimanouchi et al. | |
| 2007/0093045 | A1 | 4/2007 | Yamaguchi et al. | |
| 2008/0017925 | A1 | 1/2008 | Yamaguchi et al. | |
| 2008/0210012 | A1 | 9/2008 | Silverbrook et al. | |
| 2009/0224359 | A1 * | 9/2009 | Chang | H01L 23/5223 257/522 |
| 2009/0272206 | A1 | 11/2009 | Stumpf | |
| 2011/0000303 | A1 | 1/2011 | Fortner et al. | |
| 2011/0056302 | A1 | 3/2011 | Lutz | |
| 2011/0255228 | A1 * | 10/2011 | Kimura | G01D 5/24 361/679.01 |
| 2012/0001277 | A1 | 1/2012 | Park et al. | |
| 2012/0167659 | A1 | 7/2012 | Besling et al. | |
| 2013/0118265 | A1 | 5/2013 | Besling et al. | |
| 2013/0127042 | A1 * | 5/2013 | Lee | H01L 23/49838 257/737 |

OTHER PUBLICATIONS

Langfelder, G. et al., "MEMS Motion Sensors Based on the Variations of the Fringe Capacitances", IEEE Sensors Journal, vol. 11, No. 4, pp. 1069-1077 (Apr. 2011).

Langfelder, G., "Differential Fringe-Field MEMS Accelerometer", IEEE Transactions on Election Devices, vol. 59, No. 2, pp. 485-490 (Feb. 2012).

Machida, S., "MEMS Technology Using Back-End of Line Processes in CMOS LSI", Interconnect Technology Conference, 3 pgs (Jun. 2010).

Yan, J. et al., "An Ultra-High Sensitivity, Capacitive Pressure Sensor Using Ionic Liquid", IEEE 24th International Conference on Micro Electro Mechanical Systems, pp. 557-560 (Jan. 2011).

* cited by examiner

INTEGRATED CIRCUIT WITH A PRESSURE SENSOR

CROSS-REFERENCE TO RELATED APPLICATION

This present application is a continuation application of U.S. patent application Ser. No. 15/050,418 entitled "METHOD OF MANUFACTURING AN INTEGRATED CIRCUIT COMPRISING A PRESSURE SENSOR," filed Feb. 22, 2016, which is a divisional of U.S. patent application Ser. No. 13/915,523 entitled "INTEGRATED CIRCUIT WITH PRESSURE SENSOR HAVING A PAIR OF ELECTRODES," filed Jun. 11, 2013, now issued as U.S. Pat. No. 9,269,832, which claims priority to European Patent Application No. 12171649.2, filed Jun. 12, 2012, all of which are hereby incorporated by reference in their entirety for all purposes.

FIELD OF THE INVENTION

The present invention relates to an integrated circuit (IC), comprising a semiconductor substrate carrying a plurality of circuit elements; and a pressure sensor including a cavity on said semiconductor substrate.

The present invention further relates to a method of manufacturing such an IC.

BACKGROUND OF THE INVENTION

Nowadays, ICs are rapidly becoming complex multi-functional devices by the inclusion of several types of functionality that extends beyond the traditional computational and signal processing tasks. For instance, ICs may include sensor functionality such that the IC can be used as a monitoring device in a wide range of technical fields, e.g. medical application domains, food processing and storage, mobile telecommunication, automotive and so on. Sensor designs may include temperature sensors, relative humidity sensors, gas sensors (e.g. $O_2$, CO, $CO_2$), analyte sensors (e.g. $K^+$, $Na^+$, glucose, pH) and pressure sensors, for instance.

Although many sensor designs are known per se, integration of such a sensor design on an integrated circuit is usually far from trivial because the required miniaturization, e.g. when moving from a large scale design to IC scale, poses many non-trivial problems, not in the least because the process steps used to realize a sensor design at a larger scale cannot be used in an IC manufacturing process, such that alternative ways of realizing such designs must be uncovered.

In addition, miniaturized sensors included in an IC design may suffer from problems that are the direct result of the miniaturization, such that it is not immediately apparent how such problems can be overcome, even if the solution is found in a design that may be known per se.

Figure 1:
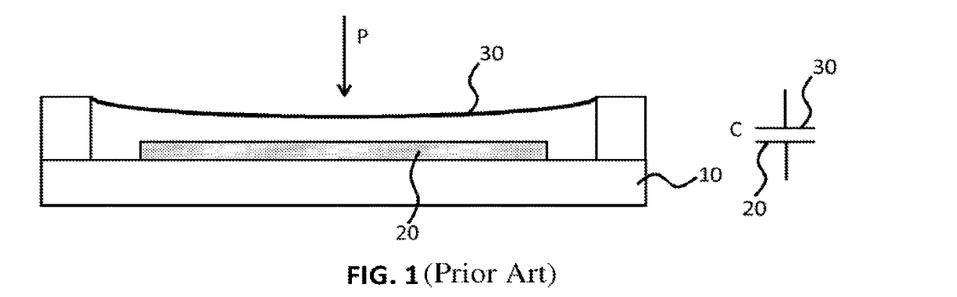
FIG. 1 schematically depicts a prior art IC comprising a pressure sensor.

An example of a known pressure sensor integrated on an IC is shown in FIG. 1. The capacitive pressure sensor is formed on a semiconductor substrate 10 and comprises first electrode 20 on the substrate 10 and a diaphragm electrode 30 over the first electrode 20, thereby defining a cavity 25 in which the first electrode 20 is formed. Under the exertion of a pressure P on the diaphragm electrode 30, this electrode deforms towards the first electrode 20, thus causing a change in the capacitance C as the distance between the first electrode 20 and the diaphragm electrode 30 is altered. This type of pressure sensor is attractive because it can be easily integrated in an IC design. However, it does suffer from some noticeable drawbacks. The sensor is typically operated by placing an (alternating) electric potential across the electrodes 20 and 30. This potential exerts a force on the diaphragm electrode 30, which can deform under this force, thus reducing the accuracy of the sensor. Also, as one of the electrodes is typically charged, this charged electrode becomes sensitive to nearby electric fields (e.g. from other circuit components) such that additional shielding, e.g. in the form of a ground shield in the substrate 10, is necessary to protect the electrode from such adjacent electric fields, which adds to the complexity of the IC design.

SUMMARY OF THE INVENTION

The present invention seeks to provide an IC having an improved pressure sensor.

The present invention further seeks to provide a method of manufacturing an IC with an improved pressure sensor.

According to an aspect of the present invention, there is provided an integrated circuit, comprising a semiconductor substrate carrying a plurality of circuit elements; and a pressure sensor including a cavity on said semiconductor substrate, said cavity comprising: a pair of electrodes laterally separated from each other; and a flexible membrane spatially separated from said electrodes such that said membrane interferes with a fringe field between said electrodes, said membrane comprising at least one aperture. Such a pressure sensor is less likely to produce erroneous results due to the fact that the membrane or diaphragm is not used as one of the capacitor plates.

Preferably, the membrane comprises a conductive layer that can be connected to ground to shield the pair of electrodes from external fields. Preferably, also an interconnect layer underneath the pair of electrodes and/or the semiconductor substrate is grounded to further improve measurement accuracy as this protects the pressure sensor from external influences.

The conductive layer may be used to improve the shielding of the sensitive fringing field capacitors from external electromagnetic interferences, and from a manufacturing point of view as the conductive material, e.g. a suitable metal, may improve the etch selectivity in e.g. a standard CMOS back-end of line (BEOL) process when forming the cavity. In addition, it may be attractive to have a conductive plate or layer in the flexible membrane e.g. for actuation/calibration or even capacitive measurement purposes, The pressure sensor may be read out using external contacts. Alternatively, at least some of said circuit elements define a capacitance measurement circuit, and wherein said electrodes are conductively coupled to said capacitance measurement circuit such that the IC is able to produce a measurement result. To this end, the IC may comprise an output, e.g. a wireless output such as a transmitter, to make the measurement result externally available.

The pair of electrodes may have any suitable shape. Preferably, the electrodes are interdigitated electrodes to ensure that the capacitor plates formed by these electrodes have a substantial area, as this further improves the sensitivity of the sensor.

In an embodiment, the integrated circuit further comprises at least one patterned metallization layer for interconnecting the plurality of circuit elements and a passivation layer over the at least one patterned metallization layer, wherein each electrode of the pair of electrodes is at least partially located on the passivation layer and conductively coupled to respective portions of the at least one patterned metallization layer.

This allows for the pressure sensor to be integrated in the backend of the IC manufacturing process, such that the other circuit elements of the IC are protected from the process steps required to manufacture the pressure sensor, and has the further advantage that high temperature steps, e.g. implant activation, have already been completed such that materials may be used that would otherwise be unsuitable due to their inability to withstand such elevated temperatures.

In an embodiment, each of the electrodes is conductively coupled to respective portions of the at least one patterned metallization layer by respective vias extending through the passivation layer. This allows for the pressure sensor to be connected to any further circuit elements on the IC using the metallization layer(s).

Each of said electrodes may further comprise an electrically insulating film on the surface facing said membrane. This has the advantage that the electrodes and the underlying passivation layer are protected during the formation of the cavity. In addition, the presence of such a layer isolates the two electrodes from each other such that no short circuit occurs when a conductive flexible membrane contacts the two electrodes. Suitable materials for such an electrically insulating film include silicon carbide (SiC), aluminium oxide ($Al_2O_3$), silicon nitride (SiN), Si-rich SiN and tantalum pentoxide ($Ta_2O_5$).

Preferably, the membrane comprises tungsten, as tungsten has a low coefficient of thermal expansion and is stress-resistant such that a robust membrane is provided that can withstand elevated temperature process steps such as a sealing step to seal the finalized IC. Other suitable membrane materials include silicon germanium (SiGe) and titanium-tungsten (TiW).

According to another aspect of the present invention, there is provided a method of manufacturing an integrated circuit comprising providing a semiconductor substrate carrying a plurality of circuit elements; and forming a pressure sensor on said substrate by: forming a pair of electrodes on the semiconductor substrate; forming a sacrificial material over the pair of electrodes; forming a patterned membrane over the sacrificial material, said pattern defining at least one aperture; and removing the sacrificial material through said at least one aperture to define a cavity between the pair of electrodes and the membrane comprising said at least one aperture, wherein the membrane is spatially separated from said electrodes such that said membrane interferes with a fringe field between said electrodes. This method allows for the manufacture of such a pressure sensor on an IC in a cost-effective manner as a limited number of additional processing steps are required and materials are used that are typically already available in the process flow.

Preferably, the membrane comprises an electrically conductive material layer for the reasons mentioned above.

Preferably, the method further comprises forming at least one patterned metallization layer for interconnecting said circuit elements over said semiconductor substrate; and forming a passivation layer over said at least one patterned metallization layer, wherein said pressure sensor is formed on the passivation layer. This has the advantage that the passivation layer forms a protection to the environment to which the pressure sensor is exposed, e.g. a protection against moisture penetration. Also, by manufacturing the pressure sensor on the metallization stack a wider range of materials may be used as previously explained.

In an embodiment, the method further comprises forming via holes through the passivation layer to provide access to respective portions of the least one patterned metallization layer; and filling said via holes with a conductive material, wherein the step of forming the electrodes comprises conductively coupling said electrodes to respective filled via holes. This allows for the pressure sensor electrodes to be electrically coupled to further circuit elements of the IC.

Preferably, the semiconductor substrate is grounded, wherein the method further comprises conductively coupling a patterned electrically conductive membrane to said semiconductor substrate. This has the advantage of shielding the pressure sensor from external fields, thus improving the accuracy of the sensor.

The method may further comprise covering the pair of electrodes with an electrically insulating film prior to forming the sacrificial material over the pair of electrodes in order to protect the electrodes and the underlying passivation layer against an etch recipe to form the cavity. The electrically insulating film may for instance operate as an etch stop layer in such an embodiment.

The method may yet further comprise defining an annular ring structure in said sacrificial material, and wherein the step of forming the cavity comprises forming said cavity within said annular structure. Such a ring structure can be used to protect structures such as bond pads adjacent to the pressure sensor from being damaged during the cavity formation step as the annular structure forms a physical barrier preventing the lateral expansion of the removal of the sacrificial material beyond the lateral dimensions of the pressure sensor.

BRIEF DESCRIPTION OF THE EMBODIMENTS

Embodiments of the invention are described in more detail and by way of non-limiting examples with reference to the accompanying drawings, wherein:

FIG. 4(a)-(l) schematically depicts an example embodiment of a manufacturing method of an IC according to the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 2:
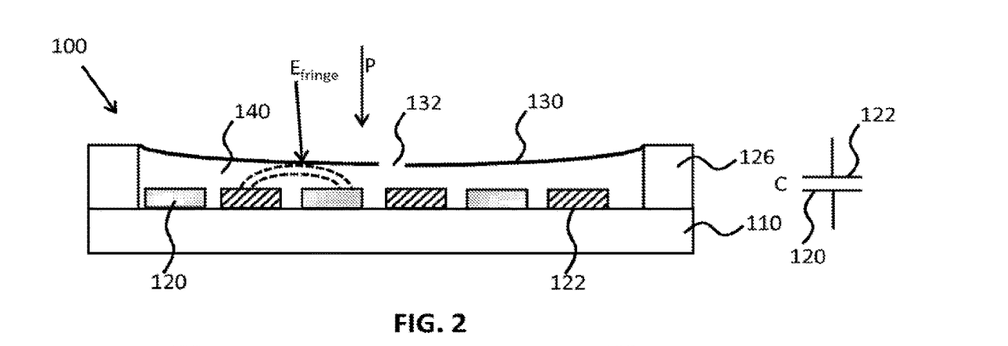
FIG. 2 schematically depicts a cross section of an IC comprising a pressure sensor according to an embodiment of the present invention.

FIG. 2 schematically depicts an IC 100 of the present invention comprising a semiconductor substrate 110 such as a Si, SiGe, silicon on insulator (SOI), GaAs, or GaN heterojunction substrate, and so on, which typically carries a plurality of circuit elements (not shown). In addition, the substrate 110 further carries a first electrode 120 laterally separated from a second electrode 122, which together form the plates of a capacitor of the pressure sensor. The electrodes may be made of any suitable conductive material, although materials that are routinely available in an existing IC process flow are preferable to limit cost. For example, aluminium may be used in a CMOS process for the electrodes 122 and 124.

A support structure 126, which typically is formed of an electrically insulating and/or a sacrificial material such as silicon oxide, silicon nitride, a low-k dielectric or combinations thereof, is mounted on the substrate 110 which support structure supports a flexible membrane 130, which preferably comprises a conductive material, e.g. W, TiW or SiGe, although it should be understood that the flexible membrane 130 may instead comprise a dielectric material only, as long as the dielectric constant of this dielectric material is larger than 1 to ensure that the material interferes with the fringe field of the electrodes. A flexible membrane 130 comprising a plurality of layers may also be contemplated, wherein a combination of electrically insulating layers and electrically conductive layers for instance may be used.

The flexible membrane 130 typically comprises at least one aperture 132 through which the material of the support structure has been locally removed to form a cavity 140 in between the pair of electrodes 120, 122 and the flexible membrane 130, e.g. by an etch step. The flexible membrane 130 is typically spaced from the pair of electrodes 120, 122 such that the fringes of the electric field ($E_{fringe}$) between the electrodes when a voltage is placed across the electrodes interfere with the flexible membrane 130, which affects the overall capacitance C of the capacitor formed by the pair of electrodes 120, 122. Variations in the pressure P on the flexible membrane 130 will cause variations in the amount of interference between the flexible membrane 130 and the fringe electric field $E_{fringe}$, which can be measured, e.g. on-chip by a measurement circuit defined by at least some of the circuit elements on the semiconductor substrate 110.

Preferably, at least one of the semiconductor substrate 110 and the flexible membrane 130 are grounded to protect the pressure sensor from interference from electric fields that are external to the pressure sensor. More preferably, both the semiconductor substrate 110 and a flexible membrane 130 comprising an electrically conductive material are grounded for this reason. This may for instance be achieved by conductively coupling a grounded semiconductor substrate 110 to the flexible membrane 130.

Although not shown in FIG. 2, the IC 100 may further comprise an electrically insulating capping layer to protect the IC from damage. Any suitable material may be used for such a capping layer; silicon nitride is mentioned as a non-limiting example.

Figure 3:
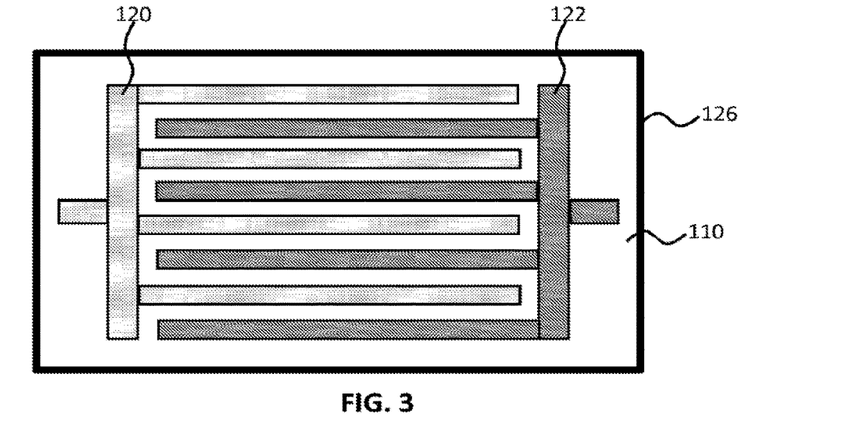
FIG. 3 schematically depicts a top view of an IC comprising a pressure sensor according to an embodiment of the present invention.

The exposed surfaces of the first electrode 120 and the second electrode 122 may be protected by a thin electrically insulating layer, i.e. an electrically insulating film such as a silicon carbide (SiC), aluminium oxide ($Al_2O_3$), silicon nitride (SiN), Si-rich SiN and tantalum pentoxide ($Ta_2O_5$) film, to protect the pressure sensor from being short-circuited in case the flexible membrane 130 comprises an electrically conductive material and inadvertently contacts both electrodes simultaneously. The electrodes 120 and 122 may be formed in any suitable spatial configuration. In a preferred embodiment, which is shown in FIG. 3, the first electrode 120 and the second electrode 122 are interdigitated comb electrodes as such an electrode lay-out ensures a electrode large surface area, and consequently a large capacitor plate area, which therefore yields a very sensitive pressure sensor as the sensitivity tends to scale with plate area.

In operation, the capacitance difference between first electrode 120 and second electrode 122 may be measured in a differential fashion, e.g. using a sigma/delta capacitance to digital converter, which has the advantage that that movement of the flexible membrane 130 as a result of electrostatic forces during the measurement cycle is prevented, thus improving the accuracy of the sensor reading.

Although the pressure sensor may be manufactured on any suitable part of the semiconductor substrate 110, it is preferred that the sensor is located on the metallization of the IC 100. Typically, an IC comprises one or more patterned metallization layers separated from each other by one or more electrically insulating material layers with different metal layers interconnected through the one or more electrically insulating material layers using vias. This is well-known per se and will therefore not been explained in more detail for the sake of brevity. It is merely pointed out that the exact nature of the metallization is outside the scope of the present invention and that any suitable material for forming such a metallization stack may therefore be contemplated.

Figure 4:
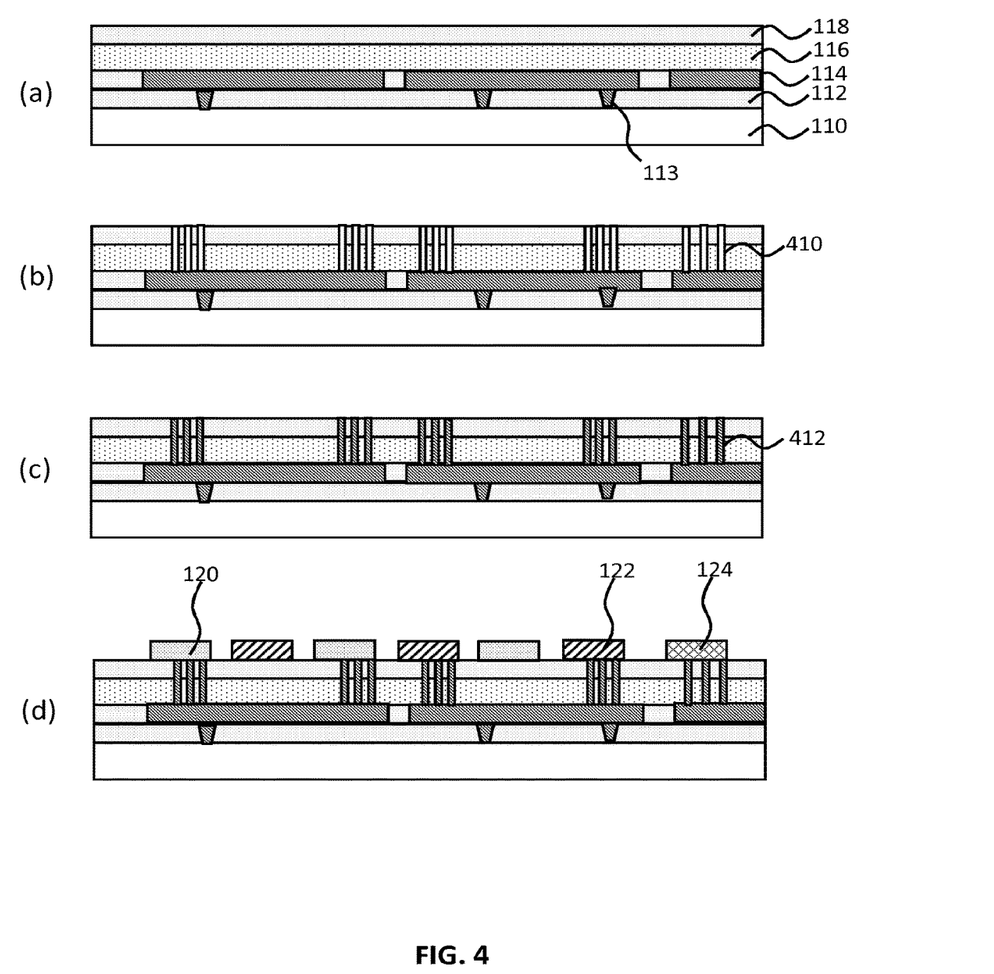

An example embodiment of the manufacture of a pressure sensor in the backend of an IC manufacturing process, i.e. on top of the metallization, is shown in FIG. 4. The method commences in step (a) with the provision of a semiconductor substrate 110 onto which a metallization stack comprising at least one patterned metal layer 114 and an electrically insulating layer 112 is formed, with conductive interconnections through the dielectric layer(s) being provided by vias 113. Any suitable number of metal layers 12 and dielectric layers 14 may be present.

Metal portions in different patterned metal layers 114 may be conductively interconnected by one or more vias 113 formed in a dielectric layer 112 in between the respective portions of the patterned metal layers 114. Any suitable material may be used to form the metallization stack, such as Ti, TiN, Al, Cu and combinations thereof to define the metal layers 114 and silicon oxide, silicon nitride, low-k dielectrics and other dielectric materials as well as combinations thereof to form the dielectric layers 112. Although in FIG. 4(a) these layers are depicted as single layers, it should be understood that these layers themselves may comprise a stack of layers, as is common design practice in contemporary semiconductor technologies such as sub-micron CMOS technologies.

A passivation stack formed by one or more passivation layers is formed over the metallization stack. In FIG. 4(a), the passivation stack comprises a silicon nitride layer 118 and a silicon oxide layer 116. Such layers may be formed in any suitable manner to any suitable thickness. By way of non-limiting example only, the silicon nitride layer 118 may be formed in a plasma-enhanced chemical vapour deposition (PE-CVD) step to a thickness of approximately 600 nm and the silicon oxide layer 116 may be formed to a thickness of approximately 1,000 nm using a high-density plasma oxidation step in a 140 nm CMOS process. A planarization step such as a chemical mechanical polishing (CMP) step may be applied to planarize the silicon nitride layer 118 if necessary. It will be obvious to the skilled person that different layer thicknesses and different materials may be used for the planarization stack depending on process technology and requirements. For instance, the silicon nitride layer 118 may be a silicon-rich SiN layer, as this material has a good selectivity towards HF vapour-based etch recipes and resists polymer formation during such an etching step.

In step (b), trenches 410 are formed through the passivation stack layers 116 and 118 using one or more suitable etch recipes to provide access to the upper metallization layer 114. A suitable diameter of the trenches 410 in a 140 nm CMOS process is 700 nm although different dimensions will obviously be appropriate for different scale technologies. The trenches 410 may be defined using any suitable mask, e.g. a hard mask or a photolithographic mask, as is well known per se to the skilled person.

Next, the trenches 410 are filled with a conductive material, e.g. tungsten, using any suitable deposition process such as chemical vapour deposition (CVD), to form vias 412. This is shown as step (c). An optional planarization step, e.g. a CMP step may be subsequently applied stopping on the passivation layer 118, e.g. a SiN layer.

In step (d), a suitable metal layer is deposited and subsequently patterned using any suitable mask to form the first electrode 120, the second electrode 122 and, if present, one or more bond pads 124. A non-limiting example of a suitable metal is aluminium, which is routinely available in a CMOS process, e.g. a 140 nm CMOS process. However, it will be understood that any suitable metal may be used, which preferably is a metal that is readily available in the chosen technology in which the IC 100 is manufactured.

Step (e) is an optional step in which the resultant structure is covered by a thin etch stop layer 414 that may also serve as a short circuit protection between the first electrode 120 and the second electrode 122 on the one hand and the flexible membrane 130 on the other hand as previously explained. Preferably, the etch stop and electrically insulating layer 414 should have an excellent etch selectivity against silicon oxide during vapour HF exposure and show excellent dielectric properties (low leakage current, high dielectric breakdown voltage, low charging). A particularly suitable material for the etch stop layer 414 may be SiC, especially when an etch recipe such as HF vapour is used to form the cavity 140 as will be explained in more detail below. The etch stop layer 414 for instance helps to protect the passivation stack from being (partially) eroded by the etch recipe. Other possible passivation and isolation materials include aluminium oxide ($Al_2O_3$), tantalum pentoxide ($Ta_2O_5$), silicon nitride (SiN), and Si-rich SiN.

In an embodiment, the thickness of the etch stop layer 414 is chosen in the range from 100-200 nm. The thickness of this layer should be tuned according to the corresponding etch selectivity of the layer material against the sacrificial material of the support structure 126 to be removed when forming the cavity 140 as well as according to the required dielectric breakdown strength.

It should also be taken into consideration that the dielectric constant of the electrically insulating film 414 has an impact on the fringing field above the electrode pairs. For this reason, SiC, SiN and Si-rich SiN are preferred materials because they can be deposited using plasma-enhanced chemical vapour deposition (PECVD) tools commonly available in CMOS fabs. SiC and Si-rich SiN are particularly preferred because they have the advantage of even higher etch selectivity against vapour HF than SiN whilst forming less residues. Alternatively, $Al_2O_3$ and $Ta_2O_5$ are also suitable materials that can be deposited with chemical vapour deposition (CVD) or atomic layer deposition (ALD) tools. The ALD method has the advantage of being able to deposited ultra thin, conformal and pinhole free films over the electrodes.

Next, a layer 416 of a sacrificial material such as $SiO_2$ or any other suitable (e.g. etchable) material is deposited over the etch stop layer 414 to a thickness that defines the gap between the electrodes 120, 122 and the flexible membrane 130. For instance, in a 140 nm CMOS process, such a sacrificial layer 416 may have a thickness ranging from 0.5-1 micron. The sacrificial layer 416 may be deposited in a single step, e.g. using CVD, PECVD, or a high density plasma (HDP). Alternatively, a multi-step process may be applied in which a first part of the sacrificial layer 416 is deposited in between the patterned metal layer followed by a planarization step such as a CMP step stopping on the etch stop layer 414, and a further deposition step to complete the sacrificial layer 416 to its required thickness.

The method then proceeds to step (g) in which a plurality of trenches are formed through the sacrificial layer 416 and the etch stop layer 414 to expose various metal portions on the passivation layer 118, e.g. by using one or more suitable etch recipes. The trench positions may be defined using any suitable type of mask. In the example embodiment shown in step (g), one or more trenches 418 provide access to the first electrode 120, one or more trenches 420 provide access to the second electrode 122, one or more trenches 422 provide access to the bond pad 124 and one or more trenches 424 define an annular guard ring around the cavity 140 to be formed.

It will be understood that at least some of the trenches may be omitted; e.g. in case no external contact to the first electrode 120 and the second electrode 122 has to be provided the trenches 418 and 420 may be omitted. The dimensions of the trenches or slits may be chosen in accordance with the applicable technology. For instance, in a 140 nm CMOS technology a diameter of approximately 700 nm may be suitable.

In step (h), the trenches 418, 420, 422 and 424 are filled with a conductive material that is deposited such that an additional conductive layer 426 is formed on the sacrificial material 416 at the same time. Preferably, the conductive material is tungsten, which may be deposited using a CVD step. Alternatively, SiGe may be considered as a suitable material for the conductive layer 426. In addition to the previously mentioned low CTE, tungsten has the further advantage that it can be deposited without the need of an additional planarization step as the thickness of the additional conductive layer 426 can be controlled accurately during the CVD step.

In step (i), the additional conductive layer 426 is patterned to define the flexible membrane 130, the annular guard ring 428 and the contacts to the bond pads and optionally to the first electrode 120 and the second electrode 122. Such patterning may be achieved using any suitable etch recipe, and any suitable mask. It is noted that the flexible membrane is patterned such that it comprises at least one aperture 132 for the release of the sacrificial material 416 to form the cavity 140. The dimensions of the apertures 132 is typically chosen as a trade-off between facilitating the rapid removal of the sacrificial material 416 (which increases with increasing aperture dimensions) and the rapid closure of the apertures 132 in case of a capping layer over the IC (which increases with decreasing aperture dimensions).

The rapid closure may be important to avoid contamination of the cavity 140 and the electrodes 120, 122 with the capping material. In a 140 nm CMOS process, the appropriate diameter for the apertures 132 ranges from 500-700 nm although it will be apparent to the skilled person that different dimensions may be appropriate in different technologies.

In step (j), contact pads may be formed on the relevant contacts of the IC, such as a contact pad 430 to the first electrode 120, a contact pad 432 to the second electrode 122 and a contact pad 434 to the bond pad 124. This may be achieved by the deposition of a suitable metal layer, e.g. an aluminium layer in a CMOS process, and the subsequent patterning of this layer using any suitable mask. The formation of such contact pads is known per se and will therefore not be discussed in any further detail.

In step (k), the sacrificial material 416 is removed from in between the flexible membrane 130 and the electrode pair 120, 122 through the one or more apertures 132 using a suitable etch recipe, e.g. a HF vapour etch in case of a $SiO_2$ sacrificial material 416, which has a very good selectivity towards W, Al and SiC. The etch stop layer 414 and the guard ring 428 protect the remainder of the IC from exposure to this etch recipe. Other etch recipes, e.g. to remove alternative sacrificial materials will be apparent to the skilled person.

The IC 100 is completed by the deposition of a capping layer 440 such as TEOS, PECVD $SiO_2$, HDP oxide, PECVD SiN, PECVD SiC and so on over the resultant structure to a thickness of 1-2 micron in a 140 nm CMOS process or to any other suitable thickness depending on the applied process technology, after which an etch step using any suitable mask is performed to selectively open the capping layer 440 to provide access to the contact pads of the IC such as contact pads 430, 432 and 434.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. An integrated circuit, comprising:
   a semiconductor substrate carrying a plurality of circuit elements;
   a pressure sensor including a cavity on the semiconductor substrate,
      wherein the cavity comprises a pair of electrodes laterally separated from each other, and a flexible membrane spatially separated from the electrodes such that the membrane interferes with a fringe field between the electrodes, and
      wherein the flexible membrane comprises tungsten as a metal layer having at least one aperture and a capping layer filling the at least one aperture and being silicon nitride; and
   a metallization stack comprising at least one patterned metallization layer for interconnecting the plurality of circuit elements and a passivation layer over the at least one patterned metallization layer,
      wherein the electrodes of the pair of electrodes are at least partially located on the passivation layer and are conductively coupled to portions of the at least one patterned metallization layer by vias extending through the passivation layer.

2. The integrated circuit of claim 1, wherein the electrodes are interdigitated electrodes.

3. An integrated circuit, comprising:
   a semiconductor substrate carrying a plurality of circuit elements;
   a pressure sensor including a cavity on the semiconductor substrate,
      wherein the cavity comprises a pair of electrodes laterally separated from each other, and a flexible membrane spatially separated from the electrodes such that the membrane interferes with a fringe field between the electrodes, and
   wherein the flexible membrane comprises a conductive layer that is connected to ground and shields the pair of electrodes from external fields; and
   an interconnect layer underneath the pair of electrodes,
      wherein the interconnect layer is grounded and protects the pressure sensor from external influences,
      wherein the electrodes comprise an electrically insulating film on the surface facing the flexible membrane, and
      wherein the material of the insulating film is silicon-rich silicon nitride or aluminum oxide.

4. The integrated circuit of claim 3, wherein the semiconductor substrate is grounded.

5. An integrated circuit, comprising:
   a semiconductor substrate carrying a plurality of circuit elements;
   a pressure sensor including a cavity on the semiconductor substrate,
      wherein the cavity comprises a pair of electrodes laterally separated from each other, and a flexible membrane spatially separated from the electrodes such that the membrane interferes with a fringe field between the electrodes;
   one or more trenches defining a guard around the cavity,
      wherein the trenches are filled with a conductive material,
      wherein the flexible membrane comprises tungsten, and
      wherein the one or more trenches are filled with tungsten; and
   a metallization stack comprising at least one patterned metallization layer for interconnecting the plurality of circuit elements and a passivation layer over the at least one patterned metallization layer,
      wherein the electrodes of the pair of electrodes are at least partially located on the passivation layer and are conductively coupled to portions of the at least one patterned metallization layer by vias extending through the passivation layer.

6. The integrated circuit of claim 5, wherein the guard is realized as a guard ring around the cavity.

7. An integrated circuit, comprising:
   a semiconductor substrate carrying a plurality of circuit elements; and
   a pressure sensor including a cavity on the semiconductor substrate,
      wherein the cavity comprises a pair of electrodes laterally separated from each other, and a flexible membrane spatially separated from the electrodes such that the membrane interferes with a fringe field between the electrodes,
      wherein at least some of the plurality of circuit elements define a capacitance measurement circuit,
      wherein the electrodes are conductively coupled to the capacitance measurement circuit that comprises a sigma/delta capacitance-to-digital converter,
      wherein the electrodes form capacitor plates,
      wherein the electrodes realize a fringing field capacitor,
      wherein the membrane is not used as one of the capacitor plates,
      wherein the electrodes comprise an electrically insulating film on the surface facing the flexible membrane, and
      wherein the material of the insulating film is silicon-rich silicon nitride or aluminum oxide.

* * * * *